United States Patent [19]
Heid

[11] Patent Number: 6,063,188
[45] Date of Patent: May 16, 2000

[54] CRUCIBLE WITH DIFFERENTIALLY EXPANDING RELEASE MECHANISM

[75] Inventor: Gary R. Heid, Vancouver, Wash.

[73] Assignee: Seh-America. Inc., Vancouver, Wash.

[21] Appl. No.: 09/081,777

[22] Filed: May 20, 1998

[51] Int. Cl.[7] .................................................. C30B 35/00
[52] U.S. Cl. ........................ 117/200; 117/216; 117/900; 373/45
[58] Field of Search ..................... 117/200, 213, 117/214, 216, 900; 373/30, 45; 432/156, 262

[56] References Cited

U.S. PATENT DOCUMENTS 5,406,905   4/1995   Yemane-Berhane et al. .
5,888,298   3/1999   Yanagimachi et al. ................. 117/200

*Primary Examiner*—Felisa Hiteshew
*Attorney, Agent, or Firm*—Oliff & Berridge, PLC

[57] ABSTRACT

A crucible is held in a closed position when the crucible is at a certain temperature. A temperature sensitive member expands differently in response to heat than other portions of the crucible. When the temperature of the temperature sensitive member is increased, the temperature sensitive member expands an amount different than do other portions of the crucible and thereby causes the crucible to open.

12 Claims, 6 Drawing Sheets

CRUCIBLE WITH DIFFERENTIALLY EXPANDING RELEASE MECHANISM

BACKGROUND OF THE INVENTION

1. Field of Invention

This invention relates to the growth of doped semiconductor crystals and, in particular, the doping of a melt as part of the process of growing the doped semiconductor crystals.

2. Description of Related Art

Semiconductor wafers can be cut from semiconductor crystals grown in a Czochralski-type crystal-growing furnace. The semiconductor wafers typically include a controlled concentration of a dopant to produce desired electrical characteristics. The dopants are typically added to a melt such as, for example, molten silicon, in the crystal-growing furnace. The silicon, for example, and the dopant mix together in a liquid state to produce a molten mixture having the desired dopant concentration. A single-crystal ingot is pulled from the molten mix.

Some dopants, such as antimony, have a vapor pressure sufficiently high to cause the concentration of dopant in the melt to change significantly as the silicon, for example, and dopant are melting together in the furnace. The change in dopant concentration cannot be accurately predicted, so the ability to accurately produce crystals having desired electrical properties is limited. To overcome this problem, several techniques have been developed for adding high vapor pressure dopants to the semiconductor after it is melted. Such techniques are difficult to perform, however, because the molten semiconductor (the "melt") must be maintained in an inert atmosphere in the crystal-growing furnace.

A Czochralski-type crystal-growing furnace typically includes two separately sealed vacuum-tight chambers. The upper chamber, or pull chamber, has space for enclosing the ingot as it is grown and includes a seed cable or shaft for lowering and raising a seed crystal. The lower chamber, or furnace tank, includes a crucible containing the melt.

Several methods for adding the dopant to the melt are known. For example, the melt can be doped by attaching a dopant to a seed crystal and then dipping the seed and dopant into the melt. However, dipping the seed into the melt, without appropriate preheating, causes thermal stress within the seed, which can result in cracks or structural defects. Preheating of the seed may cause premature dopant drop, resulting in a melt splash. Various methods for attaching the dopant to the seed so as to prevent premature dopant drop are known. One such method includes boring a transverse hole into the seed crystal, melting the dopant and then solidifying the dopant around the seed and in the hole. Alternatively, a ring of dopant can be placed over the seed and kept from dropping off by laser-welding a block of silicon to the bottom of the seed.

U.S. Pat. No. 5,406,905 shows a method of doping the melt by attaching the dopant to the seed crystal and then lowering the dopant-seed assembly to just above the melt and holding it there while heat from the melt heats the seed and the dopant, allowing the dopant to slip off of the seed.

It is also known to form the dopant into a thin electrical current-carrying wire attached to the seed crystal. The seed contacts the molten semiconductor, causing the dopant wire to melt and thereby interrupt the current flow. The interrupted current flow automatically causes a computer to begin the crystal-pulling procedure.

SUMMARY OF THE INVENTION

Embodiments of the invention provide a crucible having a portion that opens when subjected to an increase in temperature. At a given temperature, the opening portion of the crucible is held in a closed position. The crucible has a temperature sensitive portion that expands differently in response to heat than at least some other portion of the crucible. The different expansion is due to, for example, a temperature sensitive member being made from a material that expands differently in response to heat than the material from which other portions of the crucible are made. The differential expansion can also be caused by the structure of the temperature sensitive member and the structure of the other portions of the crucible. When the temperature of the temperature sensitive member is increased, the differential expansion of the temperature sensitive member and the other portions of the crucible causes the opening portion of the crucible to open.

As applied to a crucible for doping a melt as part of the process of growing doped semiconductor crystals, the temperature increase can be caused by heat radiating from the melt.

The present invention can avoid problems associated with known methods and devices for delivering dopant to the melt in a crystal-growing furnace by providing a simple device for containing the dopant and releasing the dopant close to the surface of the melt. In particular, by dropping the dopant at a releasing point that is very close to the surface of the melt, dopant particles are prevented from being blown away from the melt by eddy currents in the gasses above the melt. If dopant particles are blown away from the melt, the desired concentration of dopant in the crystal is not achieved and the resistivity of the crystal is adversely affected. A releasing point close to the surface of the melt also helps prevent melt splash. Also, the dopant can be contained within an enclosed crucible and need not be exposed to the atmosphere inside the furnace until the dopant may be dropped into the melt and, therefore, evaporation of the dopant may be reduced. In addition, because the seed crystal need not be involved in the dopant delivery process, it need not be subjected to rapid temperature changes that could cause cracking and structural defects due to thermal stress.

BRIEF DESCRIPTION OF THE DRAWINGS

The foregoing and further objects, features and advantages of the present invention will be described in or apparent from the following description of embodiments with reference to the accompanying drawings, wherein like numerals are used to represent like elements and wherein.

DETAILED DESCRIPTION OF PREFERRED EMBODIMENTS

Figure 1:
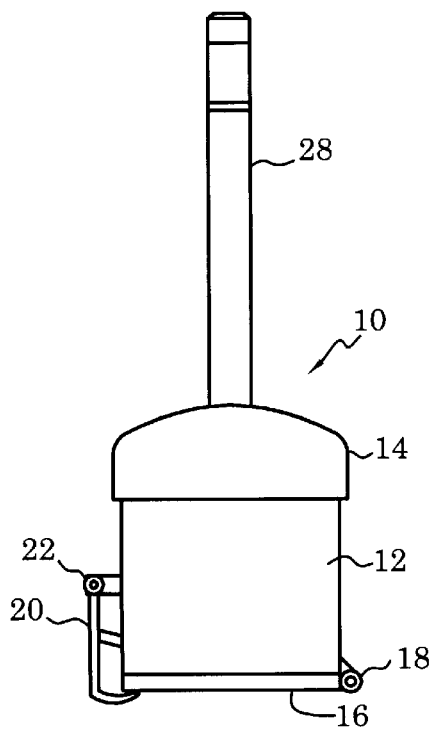
FIG. 1 is a front elevational view of a first embodiment of the invention.

In embodiments of the present invention, a crucible made of a material such as, for example, quartz has a bottom that opens by way of, for example, a hinge. The bottom of the crucible is held in a closed position by, for example, a latch. A temperature sensitive member or portion such as, for example, a pin is located, for example, between the latch and a side of the crucible. The temperature sensitive member is made of a material that expands differently in response to heat than the material from which other portions of the crucible are made.

Dopant to be added to the melt is placed in the crucible and the crucible is lowered toward the surface of the melt. As the crucible approaches the surface of the melt, the temperature of the crucible increases due to the heat radiating from the surface of the melt. Because the temperature sensitive member expands differently than other portions of the crucible, the temperature sensitive member moves some portion of the crucible and causes the latch to release the bottom of the crucible. Without the latch holding the bottom of the crucible, the bottom of the crucible is free to fall open and deliver the dopant to the melt.

In other embodiments, the bottom of the crucible is made of multiple pieces held by one or more latches. Such embodiments operate in the same manner as previously discussed, except that, because a multi-piece bottom is used, the crucible can be lowered closer to the melt before the bottom is opened without the bottom touching the melt in the open position.

In other embodiments, the bottom of the crucible is held in the closed position not by a latch, but by friction between the bottom of the crucible and a main body of the crucible. In such embodiments, the bottom of the crucible is made from a material that expands differently in response to temperature changes than the material from which the main body of the crucible is made. When the crucible is at a temperature lower than the temperature directly above the melt, the bottom and the main body of the crucible are forced together such that the bottom is held in a closed position. When the crucible is heated by heat radiating from the melt, for example, the bottom and the main body expand different amounts because they are made from materials that expand differently in response to temperature changes. This differential expansion reduces the forces that hold the bottom closed so that the bottom opens and delivers the dopant to the melt.

According to the invention, a particular structural member of the crucible can be designed so that it expands by a greater amount and/or at a faster rate than some other structural member so as to cause the crucible to open when heated. Conversely, a structural member can be designed so as to expand by a lesser amount or at a slower rate than another portion of the crucible so as to cause the crucible to open when heated.

The invention can be practiced a number of different ways. For example, the material that is used to make a particular structural member can be a different material than that which is used to make another structural member, those two different materials expanding by different amounts and/or at different rates. Alternatively, or in combination with the selection of material aspect, a structural member can be designed so as to have a physical structure that will expand by a different amount or at a different rate than some other structural member. For example, a first structural member having a lesser mass (for example because it is thinner) than a second structural member will heat-up at a faster rate than the second structural member. This will cause the first structural member to expand at a faster rate than the second structural member. This technique can be used to design crucibles according to the invention from a single type of material.

Figure 2:
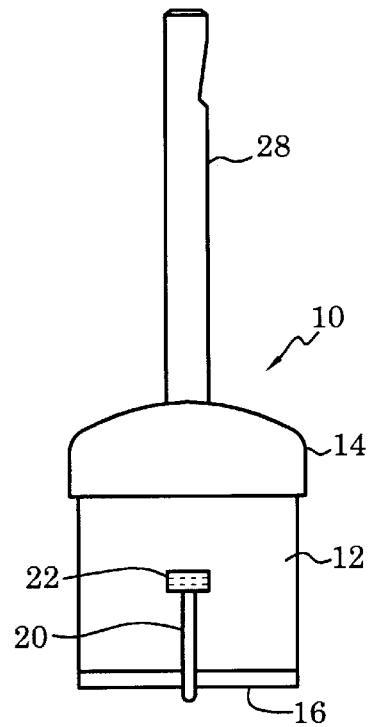
FIG. 2 is a left side elevational view of the embodiment shown in FIG. 1.
Figure 3:
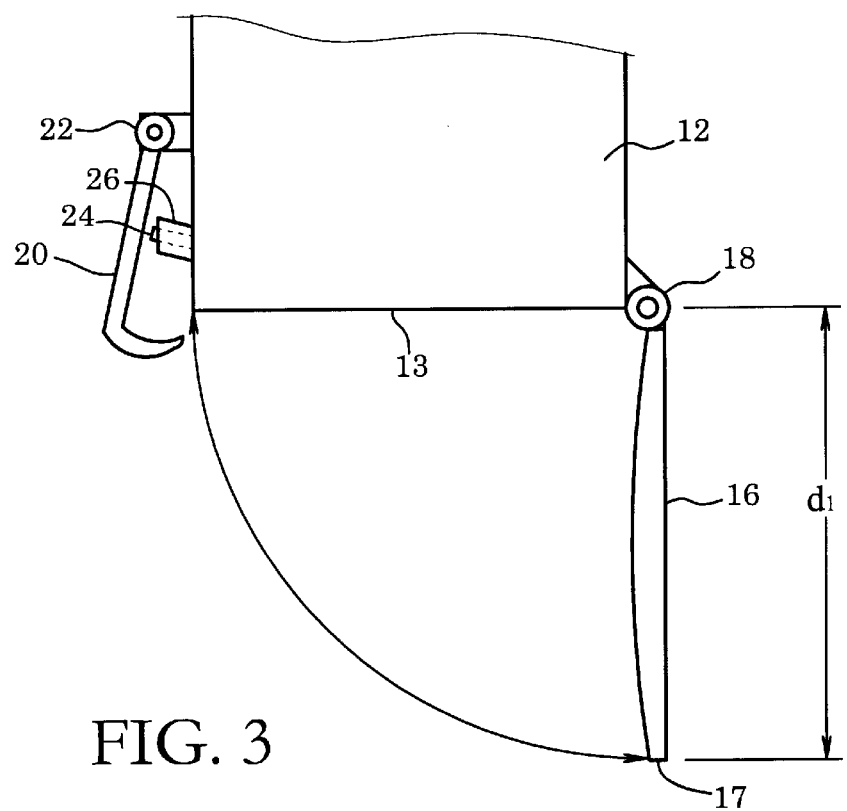
FIG. 3 is a partial front elevational view of the embodiment shown in FIGS. 1 and 2 showing the bottom of the device in an open position.
Figure 4:
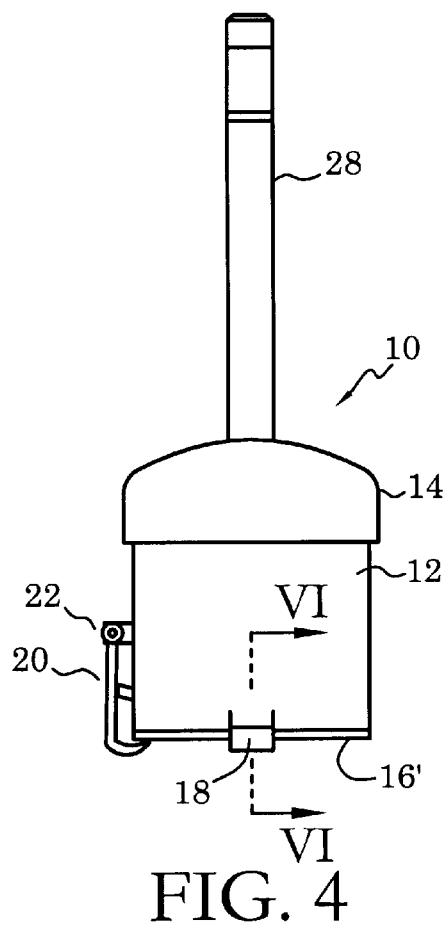
FIG. 4 is a front elevational view of a second embodiment of the invention.
Figure 5:
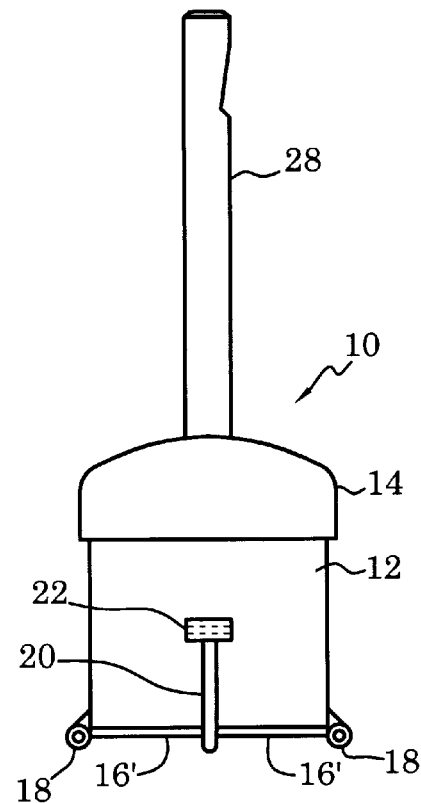
FIG. 5 is a left side elevational view of the embodiment shown in FIG. 4.

In a first embodiment of the present invention, as shown in FIGS. 1–3, a crucible 10 has a main body 12, a cover 14, and a bottom (door) 16 that is attached to the main body 12 by a hinge 18. The crucible 10 preferably is made of a material that will not introduce undesirable contaminants into the furnace, such as, for example, clear natural quartz.

The bottom 16 is held in a closed position by a latch 20, which pivots about a latch hinge 22. A temperature sensitive member such as, for example, a release pin 24 is located between the latch 20 and the main body 12. The release pin 24 is made of a material (for example a differentially expanding quartz or stainless steel) that expands differently in response to heat than the material from which the main body 12 and latch 20 are made. The release pin 24 may be held in place by a pin housing 26, or the like. The cover 14 can optionally be removed from the main body 12 and is attached to the main body 12 by a threaded connection, a bayonet connection, or the like. The crucible has a shaft 28, or similar connector, that connects the crucible to a mechanism (not shown) that raises and lowers the crucible 10 within the furnace. The shaft 28 can be configured so as also to fit into the mechanism that lowers the seed crystal into the melt, thereby avoiding the need for a separate raising and lowering mechanism.

Figure 14:
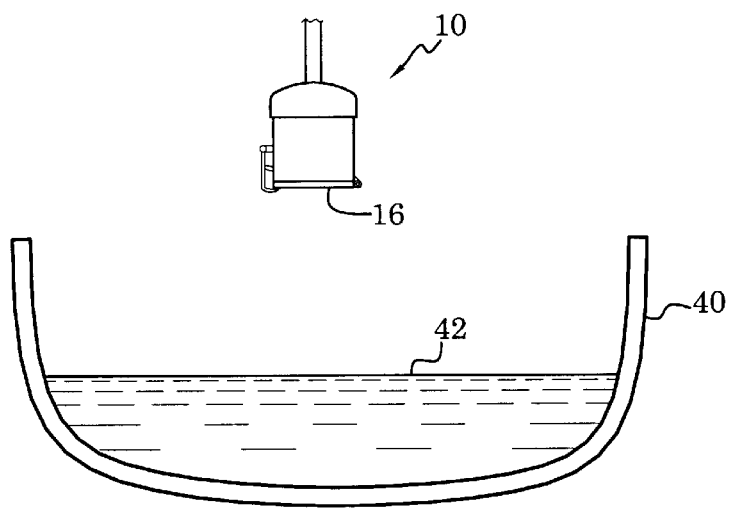
FIG. 14 shows the first embodiment before being lowered to the surface of a melt.
Figure 15:
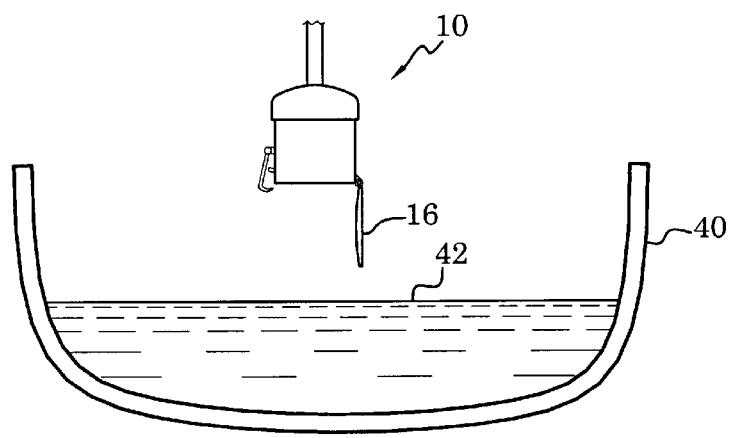
FIG. 15 shows the first embodiment after being lowered to near the surface of the melt and with the bottom of the device in an open position.

Dopant to be added to the melt 42 can be placed in the crucible 10 by removing the cover 14 and placing the dopant onto the closed bottom 16 of the crucible 10. As shown in FIGS. 14 and 15, the crucible 10 is lowered toward the surface of the melt 42, which is contained within the melt crucible 40. As the crucible 10 approaches the surface of the melt 42, the temperature of the crucible 10 increases due to the heat radiating from the surface of the melt 42. Because the release pin 24 expands differently (at a greater rate) than the crucible 10 and latch 20, the release pill 24 moves the latch 20 (to the left in FIG. 3) and causes the latch 20 to release the bottom 16 of the crucible 10. Without the latch 20 holding the bottom 16 of the crucible 10, the bottom 16 of the crucible 10 is free to fall open (as shown in FIGS. 3 and 15) and deliver the dopant to the melt 42.

Figure 6:
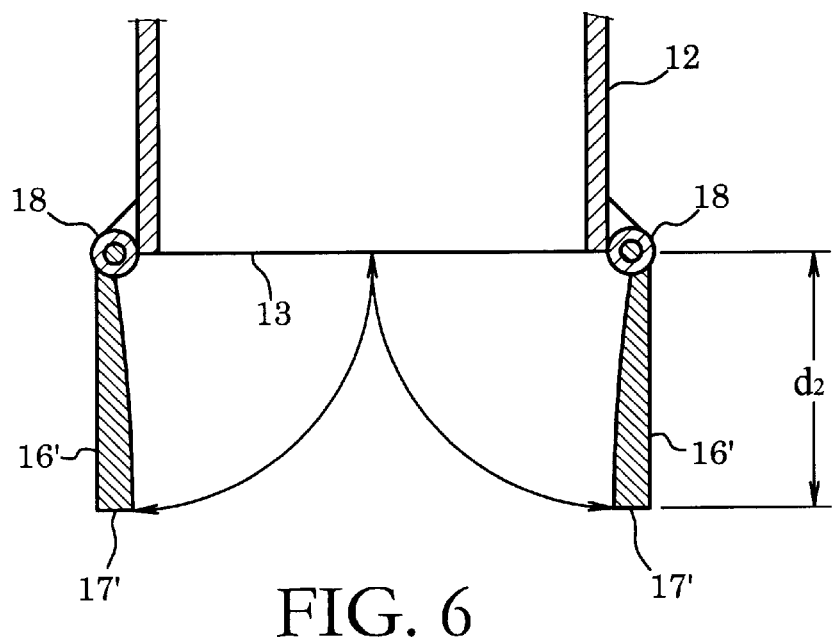
FIG. 6 is a partial sectional view taken along section line VI—VI in FIG. 4 showing the bottom of the device in an open position.
Figure 16:
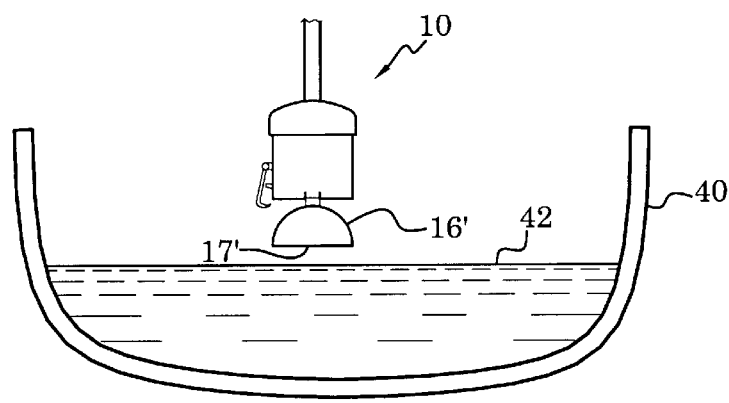
FIG. 16 shows the second embodiment after being lowered to near the surface of the melt and with the bottom of the device in an open position.

In a second embodiment, the bottom of the crucible 10 is made of multiple pieces 16' and 16' held in the closed position by one or more latches 20. In the example shown in FIGS. 4–6 and 16, the bottom is made of two pieces 16' that are held in the closed position by one latch 20. The second embodiment operates in the same manner as the first embodiment except that, because a multi-piece bottom (door) is used, the crucible 10 can be lowered closer to the melt 42 before the bottom is opened without the bottom touching the melt 42 in the open position. This is because when a multi-piece bottom is in the open position (as shown in FIGS. 6 and 16), the distance $d_2$ between each end portion 17' of the bottom 16' and the lower end 13 of the main body 12 is less than the corresponding distance $d_1$ in the first embodiment. For example, in the case of the bottom having two pieces 16' (as shown in FIG. 6), $d_2$ is approximately $\frac{1}{2}d_1$.

Figure 7:
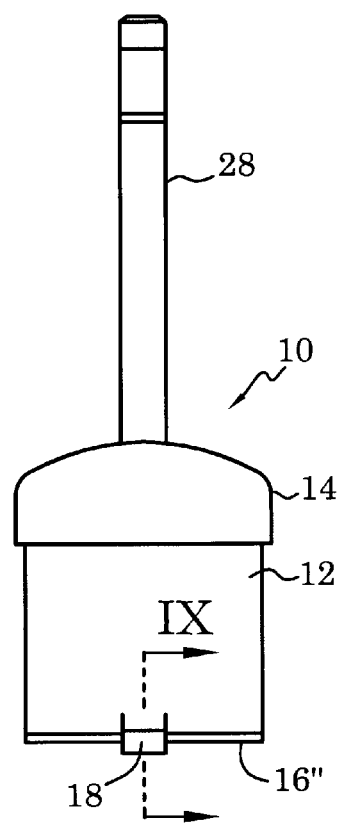
FIG. 7 is a front elevational view of a third embodiment of the invention.

In a third embodiment (shown in FIGS. 7–9), the bottom pieces 16" of the crucible 10 are held in the closed position not by a latch, but by friction between the bottom pieces 16" of the crucible 10 and the main body 12 of the crucible 10. In this embodiment, the bottom pieces 16" of the crucible 10 are made from a material that expands differently in response to temperature changes than the material from which the main body 12 of the crucible 10 is made. When the crucible 10 is at a temperature lower than the temperature directly above the melt 42, the bottom pieces 16" and the main body 12 of the crucible 10 are forced together such that the bottom pieces 16" are held in a closed position. In the closed position, a first engaging piece 30 on one end portion 17" of one bottom piece 16" engages a second engaging piece 32 on the other end portion 17" of the other bottom piece 16". When the crucible 10 is heated by heat radiating from the melt 42, for example, the bottom pieces 16" and the main body 12 expand different amounts (because they are made from materials that expand differently in response to temperature changes). This differential expansion reduces the forces that hold the bottom pieces 16" in the closed position so that the bottom pieces 16" (i.e., the door) open and deliver the dopant to the melt 42.

Figure 8:
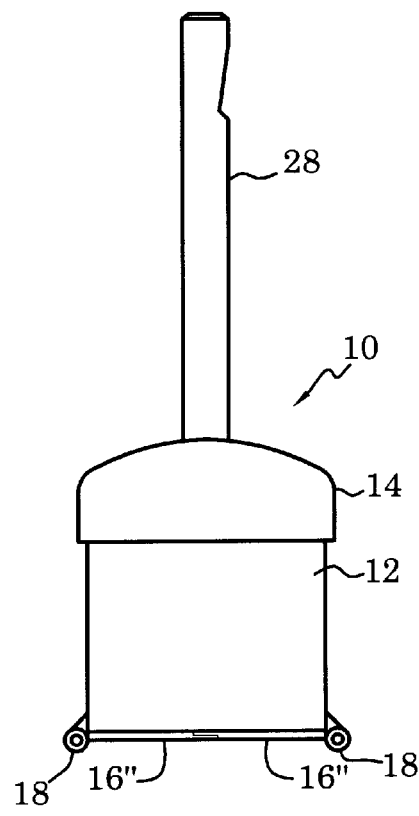
FIG. 8 is a left side elevational view of the embodiment shown in FIG. 7.
Figure 9:
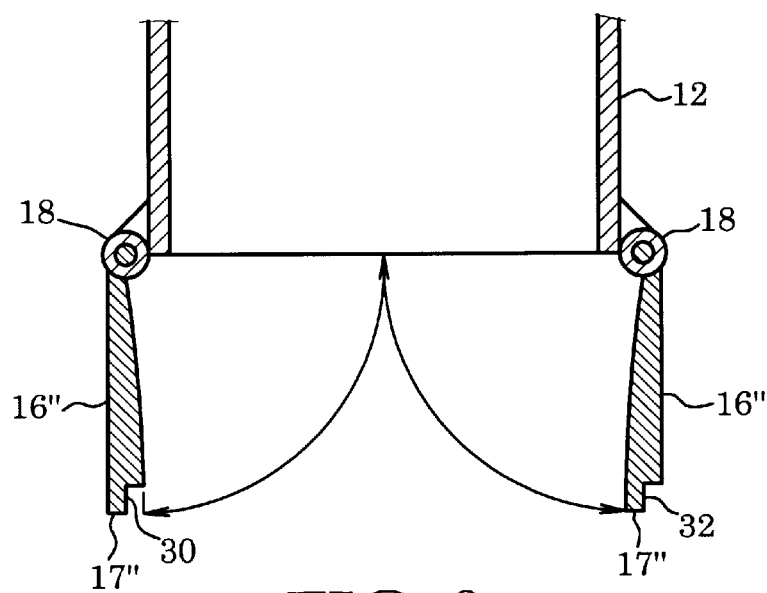
FIG. 9 is a partial sectional view taken along section line IX—IX in FIG. 7 showing the bottom of the device in an open position.

Although FIGS. 8 and 9 show the first engaging piece 30 on one end portion 17" of bottom piece 16" and the second engaging piece 32 on the other end portion 17" of bottom piece 16", it is noted that end portions 17" can be configured in any shape that provides both a sufficient seal to prevent dopant from falling from the crucible while the bottom pieces 16" are in the closed position and a sufficient bearing surface for the friction force that keeps the bottom pieces 16" in the closed position.

Although this third embodiment has been explained with reference to an example where the forces that hold the bottom pieces 16" in the closed position are between the bottom pieces 16" and the main body 12, the forces that hold the bottom pieces 16" in the closed position can, instead, be between differently expanding pieces of a multi-piece bottom.

In addition, although this third embodiment has been explained with reference to a bottom having two pieces 16", the bottom can have only one piece or more than two pieces.

In the third embodiment, the bottom pieces 16" may be made from a material that expands by a lesser amount or at a slower rate than the main body 12 so that the tightness of the fit between the bottom pieces 16" is reduced during heating to allow the bottom to open. Alternatively, the bottom pieces 16" may be made from a material that expands by a greater amount or at a faster rate than the main body 12 so that the bottom pieces pop open during heating.

Figure 10:
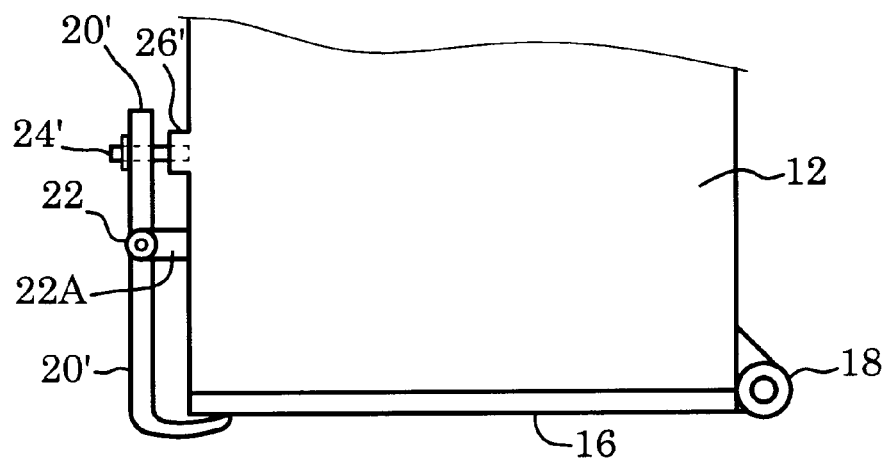
FIG. 10 is a front view of a fourth embodiment of the invention.

In a fourth embodiment, as shown in FIG. 10, the latch 20' is attached to a latch hinge support 22A by the latch hinge 22. A release pin 24' is attached at one end to the main body 12 by a pin housing 26' and is attached at the other end to the latch 20'. Release pin 24' is attached to the latch 20' such that expansion of hinge support 22A relative to release pin 24' causes latch 20' to pivot about latch hinge 22. Release pin 24' and latch hinge support 22A are made such that they expand by different amounts when subjected to a temperature change. In particular, the release pin 24' expands by a lesser amount and/or at a slower rate than the latch hinge support 22A when heated. The differential expansion can be caused, for example, by the release pin 24' and the latch hinge support 22A being made from different materials or having different structures, as well as by latch hinge support 22A shielding release pin 24' from the heat of the melt.

Figure 11:
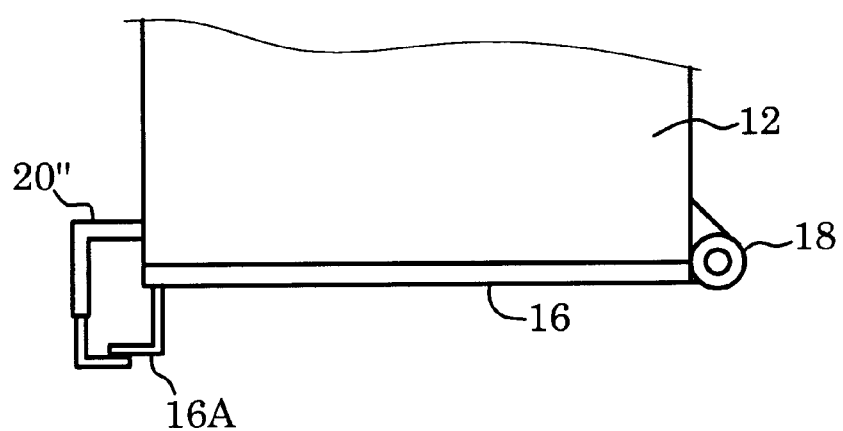
FIG. 11 is a front view of a fifth embodiment of the invention.

In a fifth embodiment, as shown in FIG. 11, the movable latch shown in several other embodiments is replaced by a fixed latch 20". In this embodiment, a bottom extension 16A is fixed to the bottom 16 of the crucible as shown, for example, in FIG. 11. Below a particular temperature, a free end of the latch 20" and a free end of the bottom extension 16A overlap such that the bottom 16 is prevented from opening. When the temperature of the crucible is increased, the latch 20" expands a different (greater) amount than the bottom extension 16A such that the free end of latch 20" and the free end of bottom extension 16A no longer overlap, thereby allowing bottom 16 to open.

Figure 12A:
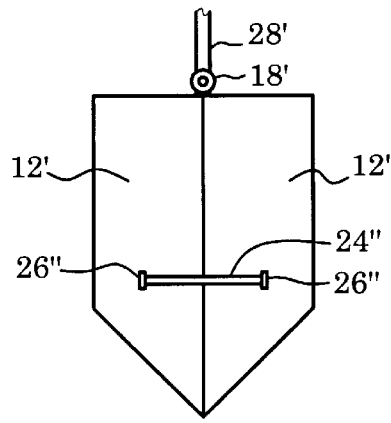
FIG. 12A is a front view of a sixth embodiment of the invention in a closed position.
Figure 12B:
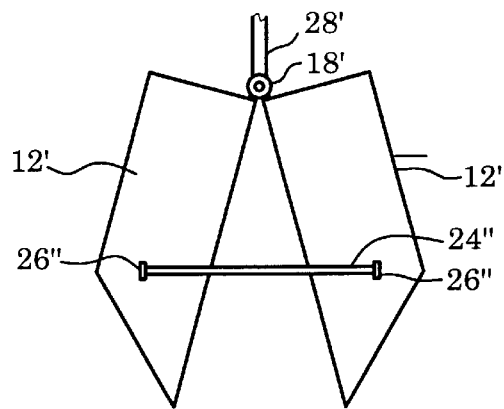
FIG. 12B is a front view of the sixth embodiment of the invention in an open position.

In a sixth embodiment, the main body of the crucible has two main body portions 12' and 12' as shown in FIGS. 12A and 12B. The main body portions 12' are connected to a common hinge 18' which is, in turn, supported by a shaft 28'. The hinge 18' is a pivot point about which one or both of the main body portions 12' pivot. In a closed position, as shown in FIG. 12A, the main body portions 12' can contain a material such as, for example, the dopant. Each end of a release pin 24" is attached to a different one of the main body portions 12' by way of a pin housing 26". As the temperature of release pin 24" is increased, release pin 24" expands and causes the main body portions 12' to rotate about hinge 18' and away from each other, allowing the material inside the crucible to fall from the crucible. The differential thermal expansion of the release pin 24" and the main body portions 12' can be caused by, for example, the release pin 24" being made from a different material than the main body portions 12' or the structure of release pin 24" relative to the structure of the main body portions 12'.

Figure 13A:
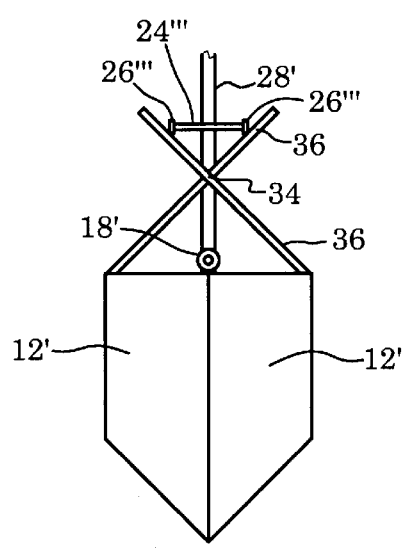
FIG. 13A is a front view of a seventh embodiment of the invention in a closed position.
Figure 13B:
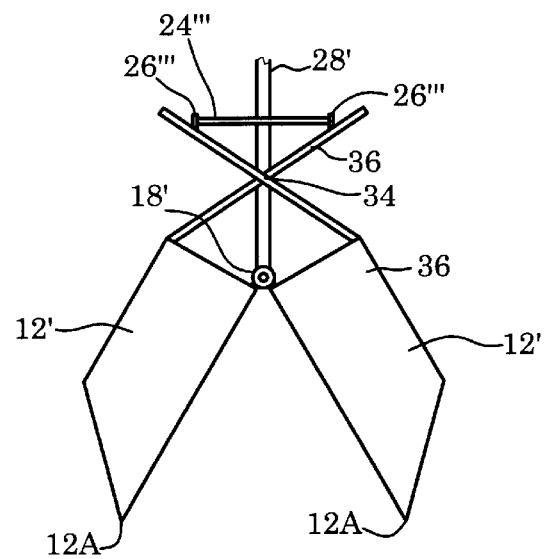
FIG. 13B is a front view of the seventh embodiment of the invention in an open position.

In a seventh embodiment, as shown in FIGS. 13A and 13B, the crucible has a similar structure to the sixth embodiment except that the release pin 24'" is located above and connected to the main body portions 12' by way of pin housings 26'" connected to a pair of connecting members 36 that are themselves connected at a pivot 34.

Additionally, portions that open upon heating need not be located on the bottom of the crucible as shown in the illustrated embodiments. For example, a door could be located on a lower side portion of the crucible and the bottom surface of the crucible could be inclined so that the dopant slides out of the crucible when the side door opens. Additionally, while gravity is relied upon for opening the door and releasing the dopant in several of the depicted embodiments, it is possible to include a biasing mechanism or material, for example, to propel the door open and expel the dopant. However, embodiments are preferred that have a simple structure, which does not introduce contaminants into the furnace.

While the present invention has been described with reference to embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A crucible for delivering a dopant to a semiconductor melt in a semiconductor crystal-growing furnace, the crucible comprising:
    a chamber having an opening portion that reversibly closes the chamber; and
    a temperature sensitive release mechanism having a differentially expanding portion, the differentially expanding portion expanding differently from another portion of the release mechanism when the release mechanism is heated from a first temperature to a second temperature greater than the first temperature, to move at least a portion of the release mechanism, thereby causing the release mechanism to open the chamber.

2. The crucible of claim 1, wherein the chamber of the crucible is made of quartz.

3. The crucible of claim 2, wherein the differentially expanding portion is made of quartz.

4. The crucible of claim 2, wherein the differentially expanding portion is made of stainless steel.

5. The crucible of claim 2, further comprising a shaft releasably attached to the chamber, the shaft being attachable to a chuck that holds a seed crystal for growing a semiconductor crystal in the semiconductor crystal-growing furnace.

6. The crucible of claim 1, wherein the release mechanism includes a latch, the latch holding the opening portion in a closed position when the latch is in a first position and releasing the opening portion when the latch is in a second position, wherein the differentially expanding portion moves the latch from the first position to the second position when the differentially expanding portion is heated from the first temperature to the second temperature.

7. The crucible of claim 6, wherein the differentially expanding portion is a pin located between the chamber and the latch.

8. The crucible of claim 6, wherein the differentially expanding portion is made from a material having a first coefficient of thermal expansion and the latch is made from a material having a second coefficient of thermal expansion different than the first coefficient of thermal expansion.

9. The crucible of claim 8, wherein the first coefficient of thermal expansion is larger than the second coefficient of thermal expansion.

10. The crucible of claim 1, wherein the differentially expanding portion is a door of the chamber.

11. The crucible of claim 10, wherein the door includes at least two pieces.

12. The crucible of claim 1, wherein the chamber has two wall parts and the release mechanism separates the two wall parts when the differentially expanding portion is heated to the second temperature.

* * * * *